United States Patent
Ozoe et al.

(10) Patent No.: US 7,800,195 B2
(45) Date of Patent: Sep. 21, 2010

(54) SEMICONDUCTOR APPARATUS HAVING TEMPERATURE SENSING DIODE

(75) Inventors: Shoji Ozoe, Chita-gun (JP); Shoji Mizuno, Okazaki (JP); Takaaki Aoki, Okazaki (JP); Tomofusa Shiga, Gamagori (JP)

(73) Assignee: DENSO CORPORATION, Kariya (JP)

( * ) Notice: Subject to any disclaimer, the term of this patent is extended or adjusted under 35 U.S.C. 154(b) by 17 days.

(21) Appl. No.: 12/071,719

(22) Filed: Feb. 26, 2008

(65) Prior Publication Data
US 2008/0203389 A1 Aug. 28, 2008

(30) Foreign Application Priority Data
Feb. 27, 2007 (JP) ............... 2007-047726

(51) Int. Cl.
*H01L 31/058* (2006.01)
(52) U.S. Cl. .............. 257/467; 257/49; 257/470; 438/54
(58) Field of Classification Search .......... 257/458, 257/345, 355, 328; 438/311
See application file for complete search history.

(56) References Cited

U.S. PATENT DOCUMENTS 4,047,435 A * 9/1977 Keith .................. 374/178
5,107,318 A * 4/1992 Makiuchi et al. ............ 257/458
5,136,348 A 8/1992 Tsuzuki et al.
5,825,067 A * 10/1998 Takeuchi et al. ............ 257/355
6,429,482 B1 * 8/2002 Culp et al. .................. 257/345

FOREIGN PATENT DOCUMENTS

| JP | B2-2649359 | 5/1997 |
| JP | A-2000-307403 | 11/2000 |
| JP | A-2002-164509 | 6/2002 |
| JP | 2005-005346 | * 1/2005 |
| JP | A-2005-005346 | 1/2005 |

OTHER PUBLICATIONS

Office Action mailed Mar. 17, 2009 in corresponding Japanese Patent Application No. 2007-47726 (and English translation).

* cited by examiner

*Primary Examiner*—Thanh V Pham
*Assistant Examiner*—Mark A Laurenzi, III
(74) *Attorney, Agent, or Firm*—Posz Law Group, PLC

(57) ABSTRACT

A semiconductor apparatus is provided. The semiconductor apparatus includes a semiconductor substrate and a temperature sensing diode that is disposed on a surface part of the semiconductor substrate. A relation between a forward current flowing through the temperature sensing diode and a corresponding voltage drop across the temperature sensing diode varies with temperature. The semiconductor apparatus further includes a capacitor that is coupled with the temperature sensing diode, configured to reduce noise to act on the temperature sensing diode, and disposed such that the capacitor and the temperature sensing diode have a layered structure in a thickness direction of the semiconductor substrate.

7 Claims, 5 Drawing Sheets

FIG. 7E

SEMICONDUCTOR APPARATUS HAVING TEMPERATURE SENSING DIODE

CROSS REFERENCE TO RELATED APPLICATION

The present application is based on Japanese Patent Application No. 2007-47726 filed on Feb. 27, 2007, the disclosure of which is incorporated herein by reference.

FIELD OF THE INVENTION

The present invention relates to a semiconductor apparatus having a temperature sensing diode.

BACKGROUND OF THE INVENTION

A semiconductor apparatus including a temperature detection sensor is disclosed in, for example, Japanese Patent Application Publication No. 2002-164509. The semiconductor apparatus includes a power semiconductor device. To prevent thermal destruction of the power semiconductor device, the temperature detection sensor having a diode is disposed in the vicinity of the power semiconductor device.

In the above configuration or the like, temperature is detected based on a signal of the temperature detection sensor. When high-frequency noise acts on the temperature detection sensor, temperature detection accuracy becomes lower. To suppress the noise, an LC low pass filter including a capacitor and an inductor is provided in a current pathway which electrically connects the temperature detection sensor with a detection circuit. The LC low pass filter is configured to cut off the high-frequency noise. The detection circuit is configured to detect the signal of the temperature detection sensor. The current pathway includes a back pathway and a forth pathway.

In the semiconductor apparatus disclosed in JP-A-2002-164509, the temperature detection sensor is comparably spaced away from the LC low pass filter and the detection circuit. The temperature detection sensor is connected with LC low pass filter and the detection circuit with using a wiring such as relay wiring and lead wiring. It is likely that the high-frequency noise, which acts on the temperature detection sensor, is not removed sufficiently due to influence of an inductance associated with the wiring.

SUMMARY OF THE INVENTION

In view of the above-described problem, it is an object of the present invention to provide a semiconductor apparatus having a temperature sensing diode.

According to a first aspect of the present invention, a semiconductor apparatus includes: a semiconductor substrate; and a temperature sensing diode that is disposed on a surface part of the semiconductor substrate. A relation between a forward current flowing through the temperature sensing diode and a corresponding voltage drop across the temperature sensing diode varies with temperature. The semiconductor apparatus further includes a capacitor that is coupled with the temperature sensing diode, configured to reduce noise to act on the temperature sensing diode, and disposed such that the capacitor and the temperature sensing diode have a layered structure in a thickness direction of the semiconductor substrate.

According to the above semiconductor apparatus, the capacitor and the temperature sensing diode have the layered structure in the thickness direction of the semiconductor substrate. The layered structure allows a line connecting between the capacitor and the temperature sensing diode to be short. Therefore, the capacitor is capable of reducing the noise acting on the temperature sensing diode.

According to a second aspect of the present invention, a semiconductor apparatus includes: a semiconductor substrate having a semiconductor region at a surface region of the semiconductor substrate; a first insulating layer that is disposed on a surface of the semiconductor substrate; a conduction layer that is disposed on the first insulating layer; a second insulating layer that is disposed on the conduction layer; a polycrystalline silicon layer that is disposed on the second insulating layer, and that includes a first polycrystalline silicon part having a first conductivity type and a second silicon polycrystalline part having a second conductivity type; a temperature sensing diode that is provided by the first and second polycrystalline silicon parts; and a capacitor that includes a first electrode provided by the conduction layer and a second electrode provided by the semiconductor region. The first conductivity type of the first polycrystalline silicon part is different from the second conductivity type of the second polycrystalline silicon part. The temperature sensing diode and the capacitor are disposed such that the capacitor and the temperature sensing diode have a layered structure in a thickness direction of the semiconductor substrate. The capacitor is electrically coupled in parallel with the temperature sensing diode such that the first polycrystalline silicon part and the second polycrystalline silicon part are, respectively, coupled with the semiconductor region and the conduction layer.

According to the above semiconductor apparatus, the capacitor and the temperature sensing diode have the layered structure in the thickness direction of the semiconductor substrate. The layered structure allows a line connecting between the capacitor and the temperature sensing diode to be short. Therefore, the capacitor is capable of reducing the noise acting on the temperature sensing diode.

According to a third aspect of the present of the present invention, a method for manufacturing a semiconductor apparatus includes: forming a first insulating layer on a surface of a semiconductor substrate by thermal oxidation; forming a conduction layer on the first insulating layer by chemical vapor deposition; forming a second insulating layer on the conduction layer; forming a polycrystalline silicon layer on the second insulating layer by chemical vapor deposition; patterning the polycrystalline silicon layer by etching; forming an N type polycrystalline silicon part in a part of the polycrystalline layer by implanting N type impurities; and forming a P type polycrystalline silicon part in another part of the polycrystalline layer by implanting P type impurities. The semiconductor substrate and the conduction layer provide a capacitor. The N type polycrystalline silicon part and the P type polycrystalline silicon part provide a temperature sensing diode. The capacitor is electrically coupled in parallel with the temperature sensing diode such that the N type polycrystalline silicon part and the P type polycrystalline silicon part are, respectively, coupled with the semiconductor substrate and the conduction layer.

According to the above method for manufacturing the semiconductor apparatus, the semiconductor device in which a capacitor and a diode have a layered structure in a thickness direction of the semiconductor substrate is provided. The layered structure allows a line connecting between the capacitor and the diode to be short. Therefore, the capacitor is capable of reducing the noise acting on the temperature sensing diode.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

A semiconductor apparatus according to a first embodiment is described below with reference to FIGS. 1A and 1B.

Figure 1A:
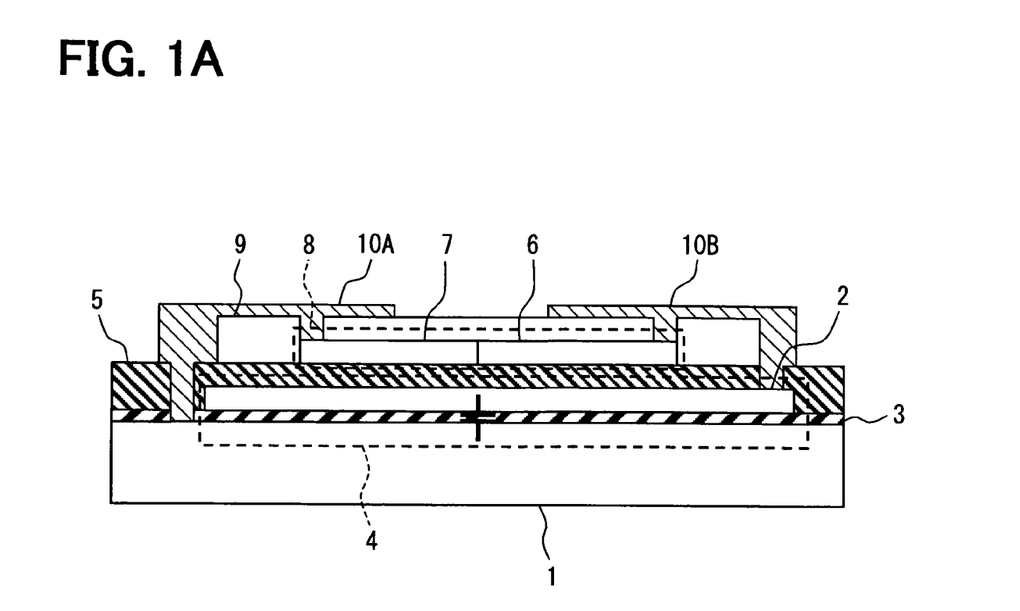
FIG. 1A is a schematic cross sectional view of a semiconductor apparatus according to a first embodiment.
Figure 1B:
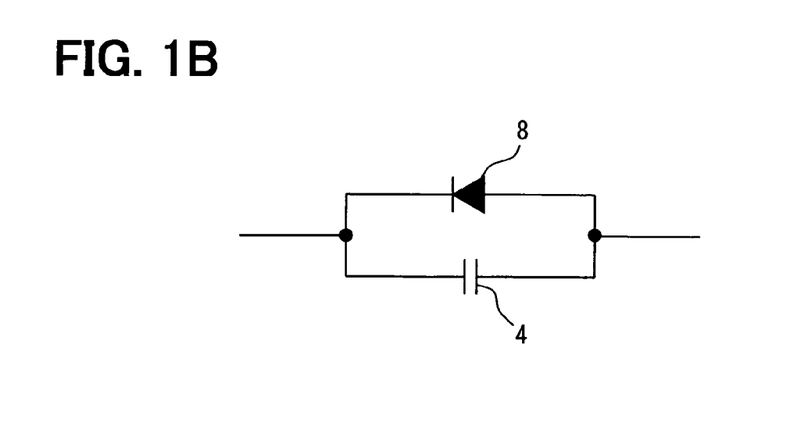
FIG. 1B is an equivalent circuit diagram of the semiconductor apparatus shown in FIG. 1A.

As shown in FIG. 1B, the semiconductor apparatus according to the present embodiment includes a temperature sensing diode 8 (i.e., a thermal diode). The temperature sensing diode 8 has such a characteristic that a relation between a value of a forward current flowing through the temperature sensing diode 8 and a value of a corresponding voltage drop across the temperature sensing diode 8 varies with temperature of the temperature sensing diode 8. The temperature sensing diode 8 is connected with a constant current source (not shown in FIGS) so that a constant current flows in the forward direction from the constant current source. When the constant current flows in the forward direction, a temperature around the temperature sensing diode 8 can be measured with, for example, a comparator (not shown in FIGS) by detecting a variation of the voltage drop across the temperature sensing diode 8.

In the semiconductor apparatus according to the present embodiment, a capacitor 4 and the temperature sensing diode 8 are connected in parallel. Thus, when the temperature sensing diode 8 is disposed in the vicinity of a power switching element in order to prevent thermal destruction of the power switching element, the capacitor 4 reduces or absorbs the high-frequency noise which is generated by switching the power switching element, and which acts on the temperature sensing diode 8.

As shown in FIG. 1, the temperature sensing diode 8 and the capacitor 4 are arranged in laminae in a thickness direction of a semiconductor substrate 1. The length of a line member or a wire for connecting the temperature sensing diode 8 with the capacitor 4 may be therefore configured to be as short as possible. As a result, the capacitor 4 is capable of reducing the high-frequency noise to act on the temperature sensing diode 8 without being influenced by inductance of the line member.

Since the temperature sensing diode 8 and the capacitor 4 have a layered structure with respect to the thickness direction of the semiconductor substrate 1, it is possible to reduce space in which the temperature sensing diode 8 and the capacitor 4 are formed in the semiconductor substrate 1. Further, it is possible to downsize the semiconductor substrate 1 and improve package density of other elements.

The semiconductor substrate 1 is made of, for example, single crystal silicon. The capacitor 4 and the temperature sensing diode 8 are formed and disposed on or over the semiconductor substrate 1.

A silicon oxide layer (SiO2 layer) 3 is formed on a surface of the semiconductor substrate 1 by thermal oxidation. The silicon oxide layer 3 functions as an insulating layer. A conduction layer 2 is formed and disposed on the silicon oxide layer 3. The conduction layer 2 is made of, for example, polycrystalline silicon. A configuration of the capacitor 4 is as follows. One electrode is a surface part of a semiconductor region. The other electrode is the conduction layer 2. A dielectric body for the capacitor 4 is the silicon oxide layer 3.

Since the surface part of the semiconductor region is used as the one electrode of the capacitor 4, P-N junction separation electrically separates the semiconductor region from its surrounding semiconductor region although not shown in FIG. 1B.

A silicon oxide layer 5 is formed so as to cover the above-described capacitor 4; thus, the capacitor 4 can be electrically separated from the temperature sensing diode 8, which is formed and disposed above the capacitor 4.

The temperature sensing diode 8 includes a P type polycrystalline silicon layer 6 and an N type polycrystalline silicon layer 7, which are formed and disposed on the silicon oxide layer 5. An example method for manufacturing the temperature sensing diode 8 is described as follows. A polycrystalline silicon is deposited on the silicon oxide layer 5 by, for example, CVD (chemical vapor deposition). The deposited silicon oxide layer is patterned by etching so as to have a rectangular shape. A thermally-oxidized layer is formed on the patterned silicon oxide layer. A series of processes including resist coat, light exposure, selective resist removal, and ion-implantation is performed. As a result, an N type region including N type implanted impurities and a P type region having P type implanted impurities are formed in the polycrystalline silicon. Then, a heat treatment is performed in inert gas atmosphere such as noble gas and nitrogen gas to homogenize impurity concentration in the polycrystalline silicon.

In the above processes, the temperature sensing diode 8 including the P type polycrystalline silicon layer 6 and the N type polycrystalline silicon layer 7 is formed. Note that, in FIG. 1A, illustrating the thermally-oxidized layer disposed on the polycrystalline silicon layer is omitted.

A BPSG (Borophosphosilicate glass) layer 9 as an interlayer insulating film is formed on or above the temperature sensing diode 8. Electrodes 10A, 10B are formed on or around the BPSG layer and the insulating layer 5 under a condition that an opening member has been formed. The opening member reaches to a semiconductor region of the surface part of the semiconductor substrate, the conduction layer 2, the P and N type polycrystalline silicon layers. The electrodes 10A, 10B are made of, for example, aluminum. The electrode 10A is partially in contact with and electrically connected with the N type polycrystalline silicon layer 7 and the semiconductor region of the surface part of the semiconductor substrate 1 through the opening member. The electrode 10B is partially in contact with and electrically connected with the P type polycrystalline silicon layer 6 and the conduction layer 2 through the opening member.

The electrodes 10A, 10B function as terminals of the temperature sensing diode 8 for having connection with an external circuit. The electrodes 10A, 10B also function as line members by which the temperature sensing diode 8 and the capacitor 4 are connected in parallel. As described above, the electrodes 10A, 10B connect the temperature sensing diode 8 with the capacitor 4. Therefore, the length of the line members for the connection is capable of being configured to be remarkably short. According to the above configuration, the capacitor 4 is capable of effectively reducing the high frequency noise, which acts on the temperature sensing diode 8, without being influenced by the inductance of the line member for the connection.

Second Embodiment

Figure 2:
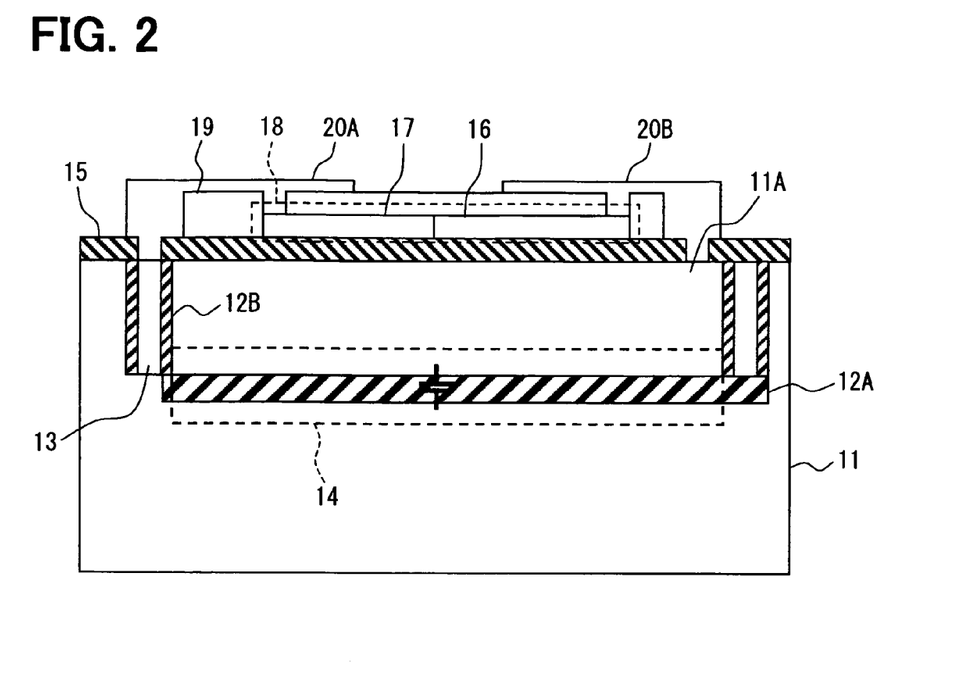
FIG. 2 is a schematic cross sectional view of a semiconductor apparatus according to a second embodiment.

A semiconductor apparatus according to a second embodiment is described below with reference to FIG. 2. While the semiconductor apparatus according to the first embodiment includes the semiconductor substrate made of single-crystalline silicon, a semiconductor substrate according to the second embodiment is a SOI (Silicon-on-Insulator) substrate. The SOI substrate has a silicon oxide layer 12A (i.e., an insulating layer) formed in an internal region of the SOI substrate and a semiconductor layer 11A disposed on the silicon oxide layer 12A.

In the SOI substrate, a trench is formed so that a depth of the trench reaches to the silicon oxide layer 12 embedded in the SOI substrate by laminating. The trench surrounds almost all around the semiconductor layer 11A disposed on the silicon oxide layer 12A. An insulating layer 12B is formed at a side wall of the trench. A silicon oxide layer is used as the insulating layer 12B, which may be formed by CVD or sputtering. Alternatively, a silicon nitride layer may be used as the insulating layer 12B. Alternatively, a composite membrane including a silicon nitride layer and a silicon oxide layer also may be used as the insulating layer 12B.

In the above configuration, the insulating layer 12B in the trench and the silicon oxide layer 12A electrically separate the semiconductor layer 11A from a semiconductor region 11 disposed around the semiconductor layer 11A. The semiconductor layer 11A is disposed on the silicon oxide layer 12A.

The above structure leads to a capacitor 14 having the following configuration. One electrode is provided by the semiconductor layer 11A disposed around the surface part of the SOI substrate. The other electrode is provided by the semiconductor region 11, a part of which faces the semiconductor layer 11A through the silicon oxide layer 12A. A dielectric body for the capacitor 14 is provided by the silicon oxide layer 12A disposed between the above two electrodes.

After the insulating layer 12B is formed at the side wall of the trench, hollow space left in a center of the trench is embedded with a conducting body such as a polycrystalline silicon 13, which ensures flatness of the semiconductor substrate. The polycrystalline silicon 13 functions as a part of a line member, the line member connecting the semiconductor region 11 with an N type polycrystalline silicon layer 17 of a temperature sensing diode 18. For the above function of polycrystalline silicon 13 to be provided, at least a part of the trench is configured such that hollow space located at a center of the part of the trench is disposed above an area to which the silicon oxide layer 12A is not extended as shown in FIG. 2 although the side wall of the corresponding trench is contact with the silicon oxide layer 12A. After the insulating layer 12B is formed at the side wall of the trench, a part of the insulating layer formed at a bottom part of the trench is removed by etching, and then, the polycrystalline silicon 13 is embedded. In the above manner, an electric connection is provided between the polycrystalline silicon 13 and the semiconductor region 11.

A silicon oxide layer 15 is formed on a surface of the SOI substrate. The temperature sensing diode 18 is formed on the silicon oxide layer 15. The temperature sensing diode 18 has a configuration almost identical to the temperature sensing diode 8 according to the first embodiment. More specifically, the temperature sensing diode 18 includes a P type polycrystalline silicon layer 16 and an N type polycrystalline silicon layer 17, which are formed and disposed on the silicon oxide layer 15. A BPSG layer 19 as an interlayer insulating film, an electrode 20A, and an electrode 20B are formed above the temperature sensing diode 18.

The electrode 20A is in contact with the N type polycrystalline silicon layer 17 via an opening member formed in the BPSG layer 19. The electrode 20A is also in contact with the polycrystalline silicon 13 via an opening member formed in the silicon oxide layer 15, the polycrystalline silicon 13 being disposed in the trench. As a result, the N type polycrystalline silicon layer 17 is electrically coupled with the semiconductor region 11 of the SOI substrate through the electrode 20A and the polycrystalline silicon 13. The electrode 20B is in contact with the P type polycrystalline silicon layer 16 via the opening member formed in the BPSG layer 19. The electrode 20B is also in contact with the semiconductor layer 11A which is disposed in the surface part of the P type polycrystalline. As a result, the P type polycrystalline silicon layer 16 is electrically coupled with the semiconductor layer 11A via the electrode 20B.

In the semiconductor apparatus according to the present embodiment, the temperature sensing diode 18 and the capacitor 14 have a layered structure in the thickness direction of the semiconductor substrate. Therefore, the temperature sensing diode 18 and the capacitor 14 are connected in parallel with using the line member having short length. The above advantage is similar to that according the first embodiment.

Third Embodiment

A semiconductor apparatus according to a third embodiment is described below with reference to FIG. 3. While the capacitor 4 according to first embodiment has the one electrode provided by the semiconductor region of the surface part of the semiconductor substrate 1, the semiconductor apparatus shown in FIG. 3 according to the present embodiment includes a capacitor 24 in which a pair of electrodes 22A, 22B is formed and configured to face each other through an interlayer insulating film 22C. The capacitor 24 is disposed on a surface part of a semiconductor substrate 21.

Figure 3:
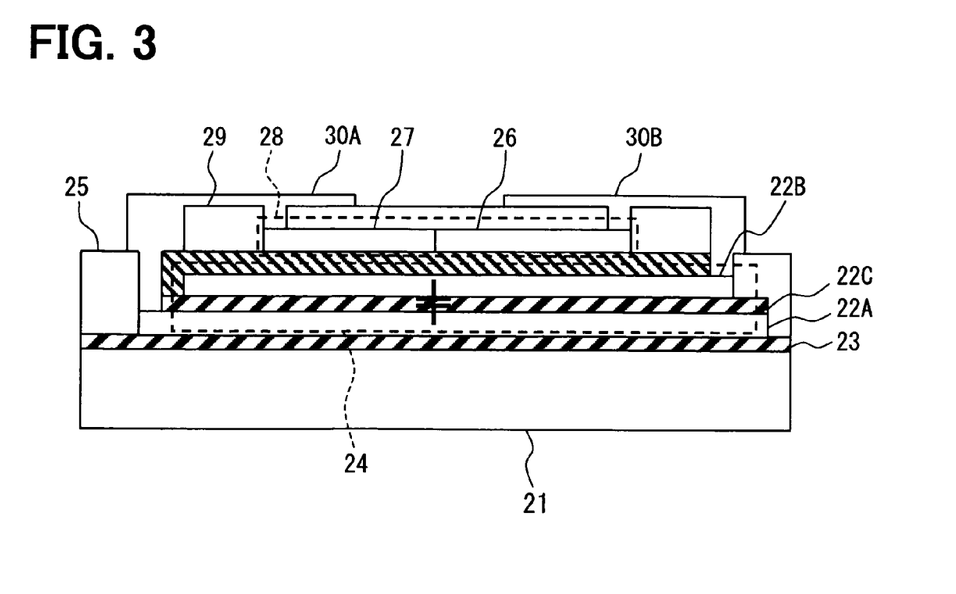
FIG. 3 is a schematic cross sectional view of a semiconductor apparatus according to a third embodiment.

More specifically, as shown in FIG. 3, an insulating layer 23 (e.g., a silicon oxide layer) is formed and disposed on a surface of the semiconductor substrate 21. The capacitor 24 is formed and disposed on the insulating layer 23. The capacitor 24 includes the pair of electrodes 22A, 22B: a bottom electrode 22A and a top electrode 22B. Each electrode 22A, 22B is electric conductor such as polycrystalline silicon, aluminum wiring layer and the like. The interlayer insulating film 22C is disposed between the pair of electrodes 22A, 22B. The interlayer insulating film 22C (e.g., a silicon oxide layer) functions as a dielectric body for the capacitor 24.

In the semiconductor apparatus according to the present embodiment, a temperature sensing diode 28 is formed and disposed above the capacitor 24. The temperature sensing diode 28 has a configuration almost identical to the temperature sending diode 8 according to the first embodiment. The temperature sensing diode 28 and the capacitor 24 are connected in parallel by electrodes 30A, 30B. A structure and a configuration of the above parallel connection according to the present embodiment are almost identical to that according to the first embodiment.

When the capacitor 24 is formed in the above manner, the temperature sensing diode 28 and the capacitor 24 are arranged in laminae in the thickness direction of the semiconductor substrate 21. Therefore, the temperature sensing diode 28 and the capacitor 24 are connected in parallel by the line member having short length. As a result, it is possible to effectively reduce high-frequency noise, which acts on the temperature sensing diode 28.

Fourth Embodiment

Figure 4:
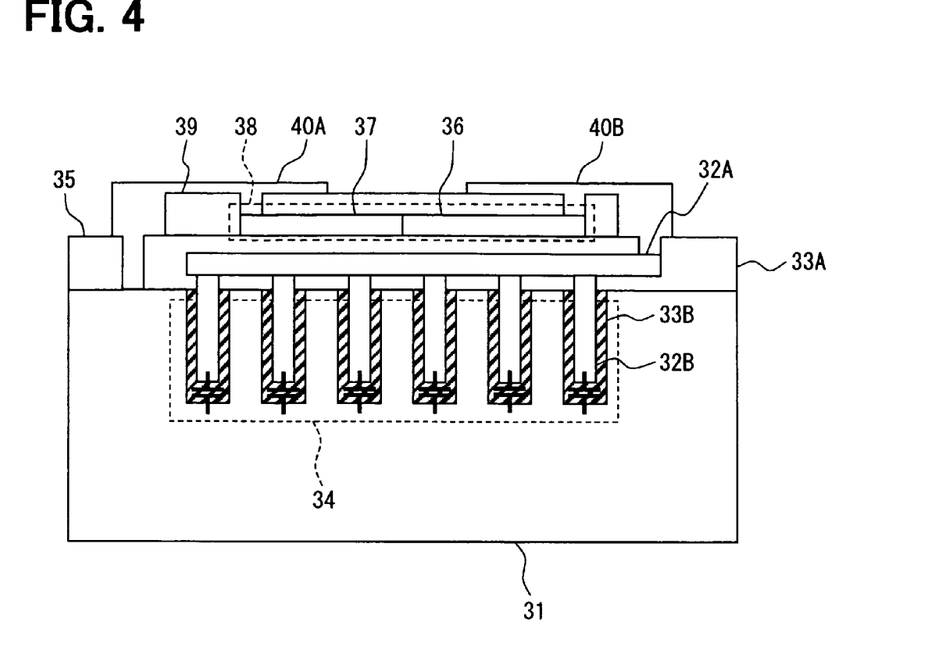
FIG. 4 is a schematic cross sectional view of a semiconductor apparatus according to a fourth embodiment.

A semiconductor apparatus according to a fourth embodiment is described below with reference to FIG. 4. The semiconductor apparatus shown in FIG. 4 includes a plurality of trenches at a surface part of a semiconductor substrate 31. Conductors 32B are disposed in and embedded in the plurality of trenches. A pair of electrodes of a capacitor 34 is provided by the conductors 32B and a semiconductor region of the semiconductor substrate 31.

Forming the plurality of trenches is from a surface of the semiconductor substrate 31. An insulating layer 33B is formed at an inner wall of the plurality of trenches. A silicon oxide layer, a silicon nitride layer, a composite layer or the like may be use as the insulating layer 33B, similarly to that according to the second embodiment. The composite layer may include a silicon oxide layer and a silicon nitride layer.

After the insulating layer 33B is formed at the inner wall of the plurality of trenches, conducting material such as polycrystalline silicon is embedded in hollow spaces left to centers of the plurality of trenches. By embedding, the conductors 32B and flatness of the semiconductor substrate are provided. Then, an insulating layer is formed at the surface of the semiconductor substrate 31 by, for example, thermal oxidation.

An opening member is formed at a part of the insulating layer so that the conductors 32B in the trenches are exposed. The part of the insulating layer corresponds to an area below which the trenches are formed. Under the above condition, conducting material such as polycrystalline silicon is deposited on the semiconductor substrate 31, which forms a conduction layer 32A on the insulating layer with filling the opening member, which is formed at the insulating layer. In the above manner, the conductors 32B disposed in the trenches are electrically connected with each other through the conduction layer 32A. An insulating layer 35 is formed and disposed on the conduction layer 32A, and then, a temperature sensing diode 38 is formed and disposed on the insulating layer 35. The temperature sensing diode 38 according the present embodiment has a configuration almost identical to that according to the second embodiment.

An electrode 40A of the temperature sensing diode 38 is in contact with an N type polycrystalline silicon layer 37 through an opening member formed at a BPSG (Borophosphosilicate glass) layer 39. The electrode 40A is also in contact with a semiconductor region of the semiconductor substrate 31 through an opening member formed at the insulating layer 35. As a result, the electrode 40A is electrically coupled with the N type polycrystalline silicon layer 37 and the semiconductor region of the semiconductor substrate 31. An electrode 40B of the temperature sensing diode 38 is in contact with a P type polycrystalline silicon layer 36 through an opening member of the BPSG layer 39. The electrode 40B is also in contact with the conduction layer 32A through an opening member formed at the insulating layer 35. As a result, the electrode 40B is electrically coupled with the P type polycrystalline silicon layer 36 and the conduction layer 32A.

In the semiconductor apparatus according to the present embodiment, the temperature sensing diode 38 and the capacitor 34 have a layered structure in the thickness direction of the semiconductor substrate 31. Therefore, the temperature sensing diode 38 and the capacitor 34 are connected in parallel with using the line member having short length. Although the plurality of trenches is formed in order to increase capacitance of the capacitor in FIG. 4, only one trench may be formed alternatively.

Fifth Embodiment

Figure 5:
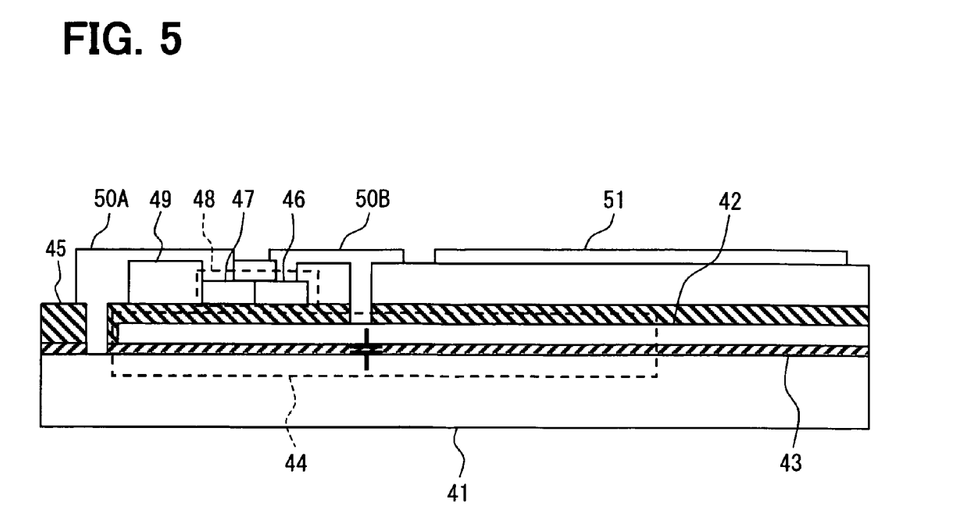
FIG. 5 is a schematic cross sectional view of a semiconductor apparatus according to a fifth embodiment.

A semiconductor apparatus according to a fifth embodiment is described below with reference to FIG. 5. The semiconductor apparatus according to the present embodiment includes a capacitor 44 and a temperature sensing diode 48, which have configurations similar to that according to the first embodiment.

More specifically, one electrode of the capacitor 44 is provided by a semiconductor region of a semiconductor substrate 41. The other electrode of the capacitor 44 is provided by a conduction layer 42. An insulating layer 43 disposed between the above two electrodes functions as a dielectric body for the capacitor 44. The temperature sensing diode 48 includes a P type polycrystalline silicon layer 46 and an N type polycrystalline silicon layer 47, which are disposed and formed above the capacitor 44. An insulating layer 45 is disposed between the capacitor 44 and the temperature sensing diode 48.

Unlike the case of the semiconductor apparatus according to the first embodiment, a MOS transistor is formed and disposed so as to be adjacent to the temperature sensing diode 48. Further, the conduction layer 42 is formed to extend to a region above which a gate electrode 51 of the MOS transistor is disposed, in addition to another region above which the temperature sensing diode 48 is disposed.

As described above, when the MOS transistor is formed in the semiconductor substrate 41, and when the conduction layer 42 extends to the region just below the gate electrode 51 of the MOS transistor, an electrode area increases. As a result, a large capacitance is provided.

Sixth Embodiment

A semiconductor apparatus according to a sixth embodiment is described below with FIG. 6. A temperature sensing diode 68 is formed and disposed on a semiconductor substrate 61. A chip capacitor 64 is mounted so as to be disposed above the temperature sensing diode 68.

Figure 6:
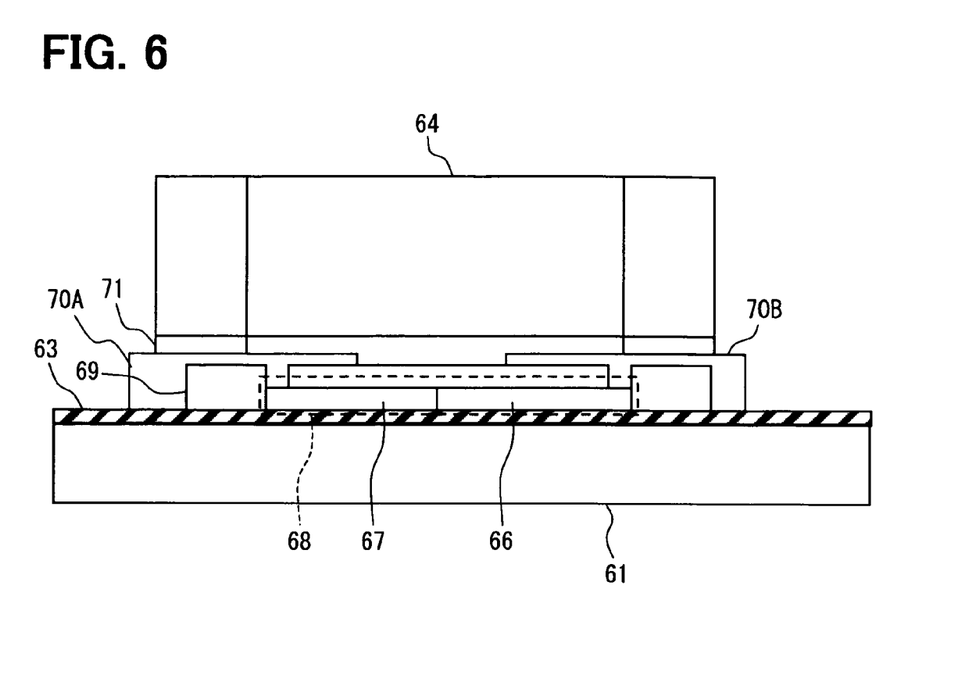
FIG. 6 is a schematic cross sectional view of a semiconductor apparatus according to a sixth embodiment.

In FIG. 6, a connection member such as solder connects electrodes 70A, 70B of the temperature sensing diode 68 with electrodes of the chip capacitor 64. In the above configuration, the temperature sensing diode 68 and the chip capacitor 64 are connected in parallel with using the connection member having a shot length.

In the semiconductor apparatus according to each above-described embodiment, one temperature sensing diode and one capacitor are connected in parallel. Alternatively, the temperature sensing diode and the capacitor may be connected differently from the above-described configurations.

Figure 7A:
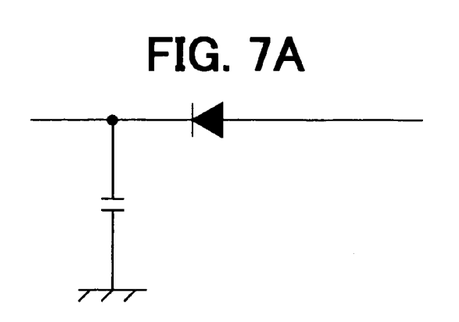
FIGS. 7A-7E are circuit diagrams according to modification embodiments.

For example, as shown in FIG. 7A, the temperature sending diode and the capacitor may be connected such that a cathode of the diode is coupled with ground via the capacitor. Alternatively, the temperature sending diode and the capacitor may be connected such that an anode of the diode is coupled with ground via the capacitor.

Figure 7B:
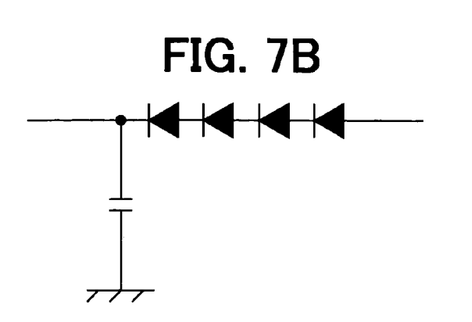

Furthermore, as shown in FIG. 7B, a plurality of temperature sensing diodes may be connected in series, and the plurality of temperature sensing diodes and the capacitor may be connected such that the cathode side of the plurality of temperature sensing diodes is coupled with ground via the capacitor.

Figure 7C:
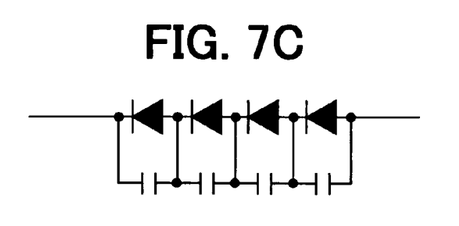

Furthermore, as shown in FIG. 7C, a plurality of temperature sensing diodes may be connected in series. A plurality of capacitors may be connected in series. Each series-connected temperature sensing diode and each capacitor may be connected in parallel. In the above case, the number of the plurality of temperature sensing diodes may be equal to the number of capacitors.

Figure 7D:
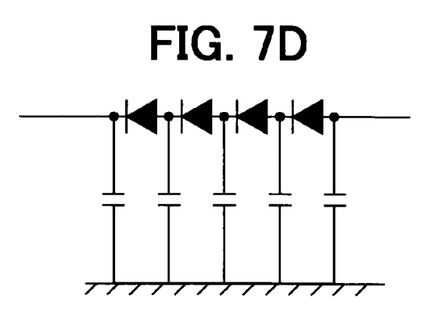

Furthermore, as shown in FIG. 7D, a plurality of temperature sensing diodes may be connected in series, and further, both a cathode and an anode of each temperature sensing diode may be coupled with ground via a capacitor. In the above case, a plurality of capacitor may be necessarily provided as shown in FIG. 7D.

Figure 7E:
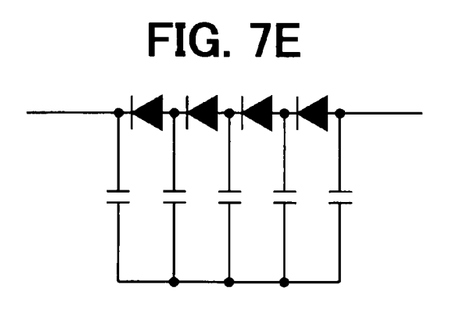

Furthermore, as shown in FIG. 7E, a plurality of temperature sensing diodes may be connected in series, and further, a cathode and an anode of each temperature sensing diode may be coupled with a common line via a capacitor. In the above case, a plurality of capacitor may be necessarily provided as shown in FIG. 7E.

In each above-described modification shown in FIG. 7A-7E, the capacitor or the capacitors can reduce the high-frequency noise to act on the temperature sensing diode or the diodes.

While the invention has been described with reference to preferred embodiments thereof, it is to be understood that the invention is not limited to the preferred embodiments and constructions. The invention is intended to cover various modifications and equivalent arrangements. In addition, while the various combinations and configurations, which are preferred, other combinations and configurations, including more, less or only a single element, are also within the spirit and scope of the invention.

What is claimed is:

1. A semiconductor apparatus comprising:
   a semiconductor substrate;
   a temperature sensing diode that is disposed on a surface part of the semiconductor substrate, wherein a relation between a forward current flowing through the temperature sensing diode and a corresponding voltage drop across the temperature sensing diode varies with temperature;
   a first wire;
   a second wire insulated from the first wire;
   a capacitor that has a first conduction member and a second conduction member;
   a first insulating layer disposed on a surface of the semiconductor substrate;
   a conduction layer disposed on the first insulating layer;
   a second insulating layer disposed on the conduction layer; and
   a polycrystalline silicon layer disposed on the second insulating layer, wherein
     the first conduction member is connected with an anode of the temperature sensing diode via the first wire,
     the second conduction member is connected with a cathode of the temperature sensing diode via the second wire,
     the capacitor is configured to reduce noise to act on the temperature sensing diode, and disposed such that the capacitor and the temperature sensing diode have a layered structure in a thickness direction of the semiconductor substrate,
     the surface part of the semiconductor substrate includes a semiconductor region,
     the capacitor includes a first electrode provided by the semiconductor region and a second electrode provided by the conduction layer, and
     the polycrystalline silicon layer provides the temperature sensing diode, which is formed by selective implantation of impurities in the polycrystalline silicon layer.

2. The semiconductor apparatus according to claim 1, further comprising:
   a MOS transistor, wherein
     the conduction layer is extended so that a part of the conduction layer is disposed below the gate electrode of the MOS transistor.

3. A semiconductor apparatus comprising:
   a semiconductor substrate;
   a temperature sensing diode that is disposed on a surface part of the semiconductor substrate, wherein a relation between a forward current flowing through the temperature sensing diode and a corresponding voltage drop across the temperature sensing diode varies with temperature;
   a first wire;
   a second wire insulated from the first wire;
   a capacitor that has a first conduction member and a second conduction member;
   a first insulating layer disposed on the semiconductor substrate; and
   a polycrystalline silicon layer disposed on the first insulating layer, wherein
     the first conduction member is connected with an anode of the temperature sensing diode via the first wire,
     the second conduction member is connected with a cathode of the temperature sensing diode via the second wire,
     the capacitor is configured to reduce noise to act on the temperature sensing diode, and disposed such that the capacitor and the temperature sensing diode have a layered structure in a thickness direction of the semiconductor substrate,
     the semiconductor substrate is an SOI substrate including a buried insulating layer as a third insulating layer,
     the semiconductor substrate includes a trench, a depth of which reaches to the third insulating layer,
     the trench includes a fourth insulating layer disposed on a side wall of the trench,
     the semiconductor substrate includes a first semiconductor region that is surround by the trench and the third insulating layer,
     the semiconductor substrate further includes a second semiconductor region that surrounds the trench and the third insulating layer,
     the third insulating layer and the fourth insulating layer electrically isolate the first semiconductor region from the second semiconductor region,
     the capacitor includes a first electrode provided by the first semiconductor region and a second electrode provided by the second semiconductor region, and the polycrystalline silicon layer provides the temperature sensing diode, which is formed by selective implantation of impurities in the polycrystalline silicon layer.

4. A semiconductor apparatus comprising:
a semiconductor substrate;
a temperature sensing diode that is disposed on a surface part of the semiconductor substrate, wherein a relation between a forward current flowing through the temperature sensing diode and a corresponding voltage drop across the temperature sensing diode varies with temperature;
a first wire;
a second wire insulated from the first wire;
a capacitor that has a first conduction member and a second conduction member;
a first insulating layer disposed on the semiconductor substrate;
a first conduction layer disposed on the first insulating layer;
a second insulating layer disposed on the first conduction layer;
a second conduction layer disposed on the second insulating layer;
a third insulating layer disposed on the second conduction layer; and
a polycrystalline silicon layer disposed on the third insulating layer, wherein
the first conduction member is connected with an anode of the temperature sensing diode via the first wire,
the second conduction member is connected with a cathode of the temperature sensing diode via the second wire,
the capacitor is configured to reduce noise to act on the temperature sensing diode, and disposed such that the capacitor and the temperature sensing diode have a layered structure in a thickness direction of the semiconductor substrate,
the capacitor includes a first electrode provided by the first conduction layer and a second electrode provided by the second conduction layer, and
the polycrystalline silicon layer provides the temperature sensing diode, which is formed by selective implantation of impurities in the polycrystalline silicon layer.

5. A semiconductor apparatus comprising:
a semiconductor substrate;
a temperature sensing diode that is disposed on a surface part of the semiconductor substrate, wherein a relation between a forward current flowing through the temperature sensing diode and a corresponding voltage drop across the temperature sensing diode varies with temperature;
a first wire;
a second wire insulated from the first wire;
a capacitor that has a first conduction member and a second conduction member;
a first insulating layer disposed on the semiconductor substrate; and
a polycrystalline silicon layer disposed on the first insulating layer, wherein
the first conduction member is connected with an anode of the temperature sensing diode via the first wire,
the second conduction member is connected with a cathode of the temperature sensing diode via the second wire,
the capacitor is configured to reduce noise to act on the temperature sensing diode, and disposed such that the capacitor and the temperature sensing diode have a layered structure in a thickness direction of the semiconductor substrate,
the semiconductor substrate includes at least one trench disposed in a semiconductor region of a surface part of the semiconductor substrate,
the at least one trench includes a fourth insulating layer disposed on an inner wall of the at least one trench,
the at least one trench further includes a conduction member filled in the at least one trench,
the capacitor includes a first electrode provided by the conduction member and a second electrode provided by the semiconductor region, and
the polycrystalline silicon layer provides the temperature sensing diode, which is formed by selective implantation of impurities in the polycrystalline silicon layer.

6. A semiconductor apparatus comprising:
a semiconductor substrate;
a temperature sensing diode that is disposed on a surface part of the semiconductor substrate, wherein a relation between a forward current flowing through the temperature sensing diode and a corresponding voltage drop across the temperature sensing diode varies with temperature;
a first wire;
a second wire insulated from the first wire;
a capacitor that has a first conduction member and a second conduction member;
a first insulating layer disposed on the semiconductor substrate; and
a polycrystalline silicon layer disposed on the first insulating layer, wherein
the first conduction member is connected with an anode of the temperature sensing diode via the first wire,
the second conduction member is connected with a cathode of the temperature sensing diode via the second wire,
the capacitor is configured to reduce noise to act on the temperature sensing diode, and disposed such that the capacitor and the temperature sensing diode have a layered structure in a thickness direction of the semiconductor substrate,
the polycrystalline silicon layer provides the temperature sensing diode, which is formed by selective implantation of impurities in the polycrystalline silicon layer, and
the capacitor is a chip capacitor disposed over the temperature sensing diode in a thickness direction of the semiconductor substrate.

7. A semiconductor apparatus comprising:
a semiconductor substrate having a semiconductor region at a surface region of the semiconductor substrate;
a first insulating layer that is disposed on a surface of the semiconductor substrate;
a conduction layer that is disposed on the first insulating layer;
a second insulating layer that is disposed on the conduction layer;
a polycrystalline silicon layer that is disposed on the second insulating layer, and that includes a first polycrystalline silicon part having a first conductivity type and a second silicon polycrystalline part having a second conductivity type;

a temperature sensing diode that is provided by the first and second polycrystalline silicon parts;
a capacitor that includes a first electrode provided by the conduction layer and a second electrode provided by the semiconductor region;
a first wire; and
a second wire insulated from the first wire, wherein
the first conductivity type of the first polycrystalline silicon part is different from the second conductivity type of the second polycrystalline silicon part,
the temperature sensing diode and the capacitor are disposed such that the capacitor and the temperature sensing diode have a layered structure in a thickness direction of the semiconductor substrate, and
the temperature sensing diode is electrically coupled in parallel with the capacitor such that the first polycrystalline silicon part is connected with the semiconductor region via the first wire and the second polycrystalline silicon part is connected with the conduction layer via the second wire.

* * * * *